(12) United States Patent
Yang et al.

(10) Patent No.: US 10,122,337 B2
(45) Date of Patent: Nov. 6, 2018

(54) PROGRAMMABLE GAIN AMPLIFIER

(71) Applicant: SILICON INTEGRATED SYSTEMS CORP., Hsinchu (TW)

(72) Inventors: Ssu-Che Yang, Hsinchu (TW); Wen-Chi Lin, Hsinchu (TW); Keng-Nan Chen, Hsinchu (TW)

(73) Assignee: SILICON INTEGRATED SYSTEMS CORP., Hsinchu (TW)

( * ) Notice: Subject to any disclaimer, the term of this patent is extended or adjusted under 35 U.S.C. 154(b) by 0 days.

(21) Appl. No.: 15/669,798

(22) Filed: Aug. 4, 2017

(65) Prior Publication Data

US 2018/0152157 A1    May 31, 2018

(30) Foreign Application Priority Data

Nov. 30, 2016 (TW) .............................. 105139564 A

(51) Int. Cl.
*H03G 1/00* (2006.01)
*H03F 1/02* (2006.01)
*H03F 1/26* (2006.01)
*H03F 3/45* (2006.01)
*H03G 3/00* (2006.01)

(52) U.S. Cl.
CPC ......... *H03G 1/0088* (2013.01); *H03F 1/0233* (2013.01); *H03F 1/26* (2013.01); *H03F 3/45215* (2013.01); *H03F 3/45273* (2013.01); *H03G 1/0029* (2013.01); *H03G 3/001* (2013.01); *H03F 3/45* (2013.01); *H03F 2203/45026* (2013.01)

(58) Field of Classification Search
CPC .... H03F 3/45; H03F 3/45183; H03F 3/45179; H03F 3/45188; H03F 3/45192; H03F 2200/177; H03F 1/0233; H03G 1/0023; H03G 1/0029; H03G 1/0035; H03G 1/0088; H03G 3/00; H03G 2201/10
USPC ................................ 330/253, 254, 257, 260
See application file for complete search history.

(56) References Cited

U.S. PATENT DOCUMENTS

| | | | | |
|---|---|---|---|---|
| 5,596,289 A * | 1/1997 | Liu | ....................... | H03F 3/3023 330/260 |
| 7,126,423 B1 * | 10/2006 | Kruiskamp | ............... | H03F 1/34 330/253 |
| 8,456,232 B2 * | 6/2013 | Groeneweg | ......... | H03F 3/45183 327/359 |
| 2015/0002221 A1 * | 1/2015 | Van Helleputte | ......... | H03F 3/68 330/69 |

* cited by examiner

*Primary Examiner* — Khanh V Nguyen
(74) *Attorney, Agent, or Firm* — Maschoff Brennan

(57) ABSTRACT

A programmable gain amplifier includes an active load module, a first differential pair, a second differential pair and a power source module. The first and second differential pairs are electrically connected to the active load module. The power source module is electrically connected to the first current source end of the first differential pair and the second current source end of the second differential pair. The power source module supplies a first current to the first differential pair through the first current source end. The power source module supplies a second current to the second differential pair through the second current source end. The power source module adjusts the potential of the first current, the potential of the second current, or both.

10 Claims, 4 Drawing Sheets

US 10,122,337 B2

PROGRAMMABLE GAIN AMPLIFIER

CROSS-REFERENCE TO RELATED APPLICATIONS

This non-provisional application claims priority under 35 U.S.C. § 119(a) on Patent Application No(s). 105139564 filed in Taiwan, R.O.C. on Nov. 30, 2016, the entire contents of which are hereby incorporated by reference.

TECHNICAL FIELD

The disclosure relates to a programmable gain amplifier, more particularly to a programmable gain amplifier having a feedback loop.

BACKGROUND

To satisfy or efficiently utilize the dynamic range of a backend circuit, technical personnel usually add a programmable gain amplifier (PGA) into the transmission between a signal source and a backend circuit and employ the programmable gain amplifier to selectively amplify signals with a variable magnification power to make these signals match the standard of the backend circuit or the signal standard defined by the users.

Typically, conventional programmable gain amplifiers, such as non-inverting amplifiers, are designed with one or more operational amplifiers and one or more resistors. However, programmable gain amplifiers with such a structure cannot efficiently block noises, and they amplify noises while amplifying desired signals so that the signal-to-noise ratio (SNR) in the outputs of the programmable gain amplifiers decreases.

SUMMARY

According to one or more embodiments, a programmable gain amplifier includes an active load module, a first differential pair, a second differential pair and a power source module. The active load module includes a first load end and a second load end. The first differential pair includes a first input end, a second input end, a first current source end, a first output end and a second output end. The second differential pair includes a third input end, a fourth input end, a second current source end, a third output end and a fourth output end. The second load end of the active load module is electrically connected to an output end of the programmable gain amplifier. The first output end of the first differential pair is electrically connected to the first load end of the active load module. The second output end of the first differential pair is electrically connected to the second load end of the active load module. The first input end of the first differential pair is configured to receive an input signal. The second input end of the first differential pair is configured to receive a common mode voltage. The fourth output end of the second differential pair is electrically connected to the second load end of the active load module. The third output end of the second differential pair is electrically connected to the first load end of the active load module. The third input end of the second differential pair is electrically connected to the output end of the programmable gain amplifier in order to receive a feedback signal. The fourth input end of the second differential pair is configured to receive a common mode voltage. The power source module is electrically connected to the first current source end of the first differential pair and second current source end of the second differential pair. The power source module is configured to supply a first current to the first differential pair through the first current source end of the first differential pair, and supply a second current to the second differential pair through the second current source end of the second differential pair. The power source module is configured to adjust the potential of the first current, the potential of the second current, or both.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
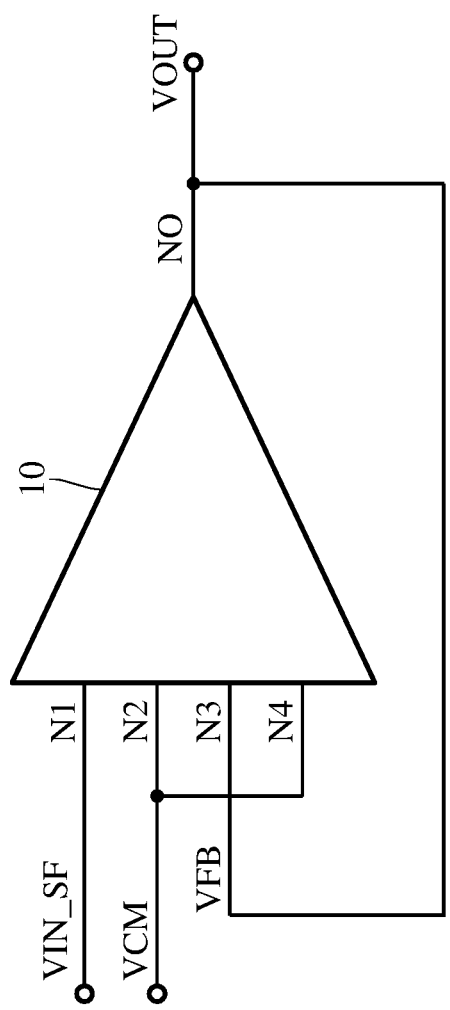
FIG. 1 is an equivalent circuit diagram of a programmable gain amplifier according to an embodiment of the present disclosure.

Please refer to FIG. 1 to explain the input and output of the programmable gain amplifier provided in the present disclosure. FIG. 1 is an equivalent circuit diagram of a programmable gain amplifier according to an embodiment of the present disclosure. The programmable gain amplifier 10 includes input ends N1~N4 and an output end NO. The input end N1 is configured to receive an input signal VINSF. The input end N2 and the input end N4 are configured to receive a common mode voltage VCM. The input end N3 is electrically connected to the output end NO and thus, a feedback loop is formed. On another aspect, an output signal VOUT serving as a feedback signal VFB is applied to the input end N3. The common mode voltage VCM is, for example, a common mode bias provided by a previous stage circuit with respect to the programmable gain amplifier 10.

Figure 2:
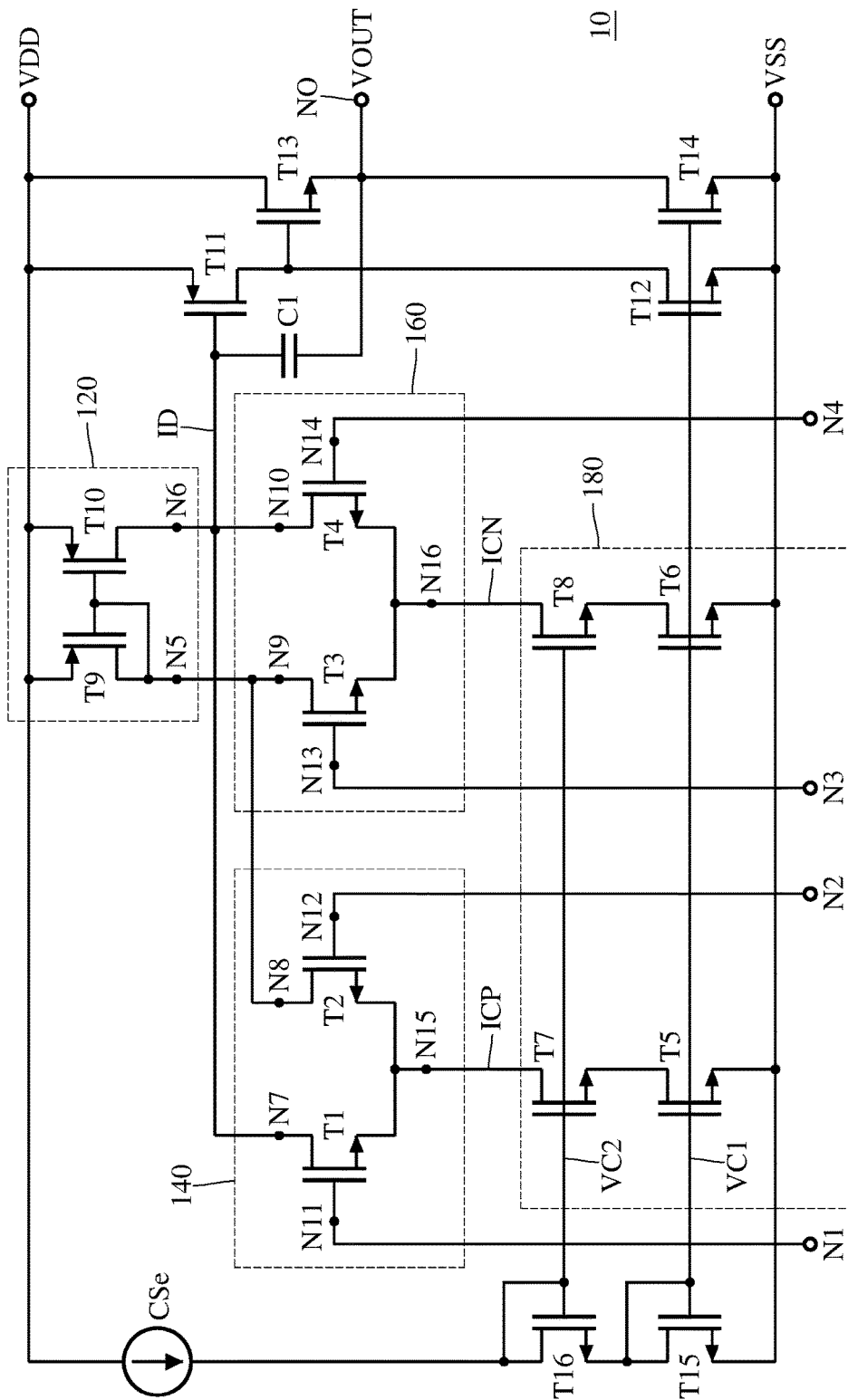
FIG. 2 is a schematic circuit diagram of a programmable gain amplifier according to another embodiment of the present disclosure.

Please refer to FIG. 2 illustrating a schematic circuit diagram of a programmable gain amplifier according to another embodiment of the present disclosure. The programmable gain amplifier 10 includes an active load module 120, a first differential pair 140, a second differential pair 160 and a power source module 180.

The active load module 120 includes a first load end N5 and a second load end N6 that is electrically connected to the output end NO. The active load module 120 is configured to provide an adjustable equivalent load.

The first differential pair 140 includes a first input end N11, a second input end N12, a first current source end N15, a first output end N7 and a second output end N8. The first output end N7 is electrically connected to the second load end N6. The second output end N8 is electrically connected to the first load end N5. The first input end N11 is configured to receive an input signal VINSF through the input end N1. The second input end N12 is configured to receive the common mode voltage VCM through the input end N2. The first differential pair 140 is configured to adjust a current, flowing through the first load end N5, and a current, flowing through the second load end N6, according to a first current ICP, the input signal VINSF and the common mode voltage VCM. On another aspect, the first input end N11 can also be defined as the input end N1 shown in FIG. 1, and the second input end N12 can also be defined as the input end N2 shown in FIG. 1.

The second differential pair 160 includes a third input end N13, a fourth input end N14, a second current source end N16, a third output end N9 and a fourth output end N10. The third output end N9 is electrically connected to the first load end N5. The fourth output end N10 is electrically connected to the second load end N6. The third input end N13 is electrically connected to the third input end N13, so as to receive a feedback signal VFB. The fourth input end N14 is electrically connected to the input end N4, so as to receive the common mode voltage VCM. The second differential pair 160 is configured to adjust a current, flowing through the first load end N5, and a current, flowing through the second load end N6, according to a second current ICN, the feedback signal VFB and the common mode voltage VCM. On another aspect, the input end N13 can also be defined as the input end N3 shown in FIG. 1, and the fourth input end N14 can also be defined as the input end N4 shown in FIG. 1.

The power source module 180 is electrically connected to the first current source end N15 and the second current source end N16, and is configured to supply the first current ICP to the first differential pair 140 through the first current source end N15 and supply the second current ICN to the second differential pair 160 through the second current source end N16. The power source module 180 is also configured to adjust either the potential of the first current ICP, the potential of the second current ICN or both. In different embodiments, the power source module 180 is configured to adjust the potential of the first current ICP and the second current ICN can substantially be considered a constant current; optionally, the power source module 180 is configured to adjust the potential of the second current ICN and the first current ICP can substantially be considered a constant current; and optionally, the power source module 180 is configured to individually adjust the potential of the first current ICP and the potential of the second current ICN.

In an embodiment, when the first current ICP is substantially equal to the second current ICN, the programmable gain amplifier 10 has an equivalent gain of about 2. When the first current ICP is larger than the second current ICN, the equivalent gain is larger than 2. When the first current ICP is less than the second current ICN, the equivalent gain is smaller than 2. In this embodiment, the definition of the equivalent gain is a ratio between the voltage potential of the input signal VINSF and the potential of the output voltage VOUT.

Please still refer to FIG. 2 to explain the detailed circuit structure of each function module. The first differential pair 140 includes a first transistor T1 and a second transistor T2. The first end and second end of the first transistor T1 are respectively and electrically connected to the second load end N6 and the power source module 180. The control end of the first transistor T1 is electrically connected to the input end N1, so as to receive the input signal VINSF. The first end of the second transistor T2 is electrically connected to the first load end N5, and the second end of the second transistor T2 is electrically connected to the power source module 180 and the second end of the first transistor T1. The control end of the second transistor T2 is electrically connected to the input end N2, so as to receive the common mode voltage VCM. In other words, the first differential pair 140 is configured to adjust a ratio between a current, flowing through the first transistor T1, and a current, flowing through the second transistor T2, according to the input signal VINSF and the common mode voltage VCM, so as to adjust the potential of the current flowing through the first load end N5 and the potential of the current flowing through the second load end N6.

The second differential pair 160 includes a third transistor T3 and a fourth transistor T4. The first end and second end of the third transistor T3 are respectively and electrically connected to the first load end N5 and the power source module 180, and the control end of the third transistor T3 is electrically connected to the input end N3, so as to receive the feedback signal VFB. The first end of the fourth transistor T4 is electrically connected to the second load end N6, the second end of the fourth transistor T4 is electrically connected to the power source module 180 and the second end of the third transistor T3, and the control end of the fourth transistor T4 is electrically connected to the input end N4, so as to receive the common mode voltage VCM. In other words, the second differential pair 160 is configured to adjust a ratio between a current, flowing through the third transistor T3, and a current, flowing through the fourth transistor T4, according to the feedback signal VFB and the common mode voltage VCM, so as to adjust the potential of the current flowing through the first load end N5 and the potential of the current flowing through the second load end N6.

Please refer to FIG. 2 again to explain one or more concrete embodiments of the power source module. In the embodiment shown in FIG. 2, the power source module further includes a fifth transistor T5 and an equivalent sixth transistor T6. The first end of the fifth transistor T5 is electrically connected to the first current source end N15, the second end of the fifth transistor T5 is configured to receive a second basis voltage VSS, and the control end of the fifth transistor T5 is configured to receive a first control voltage VC1. The first end of the equivalent sixth transistor T6 is electrically connected to the second current source end N16, the second end of the equivalent sixth transistor T6 is configured to receive the second basis voltage VSS, and the control end of the equivalent sixth transistor T6 is configured to receive the first control voltage VC1. In this case, the current flowing through the equivalent sixth transistor T6 is adjustable.

Figure 3:
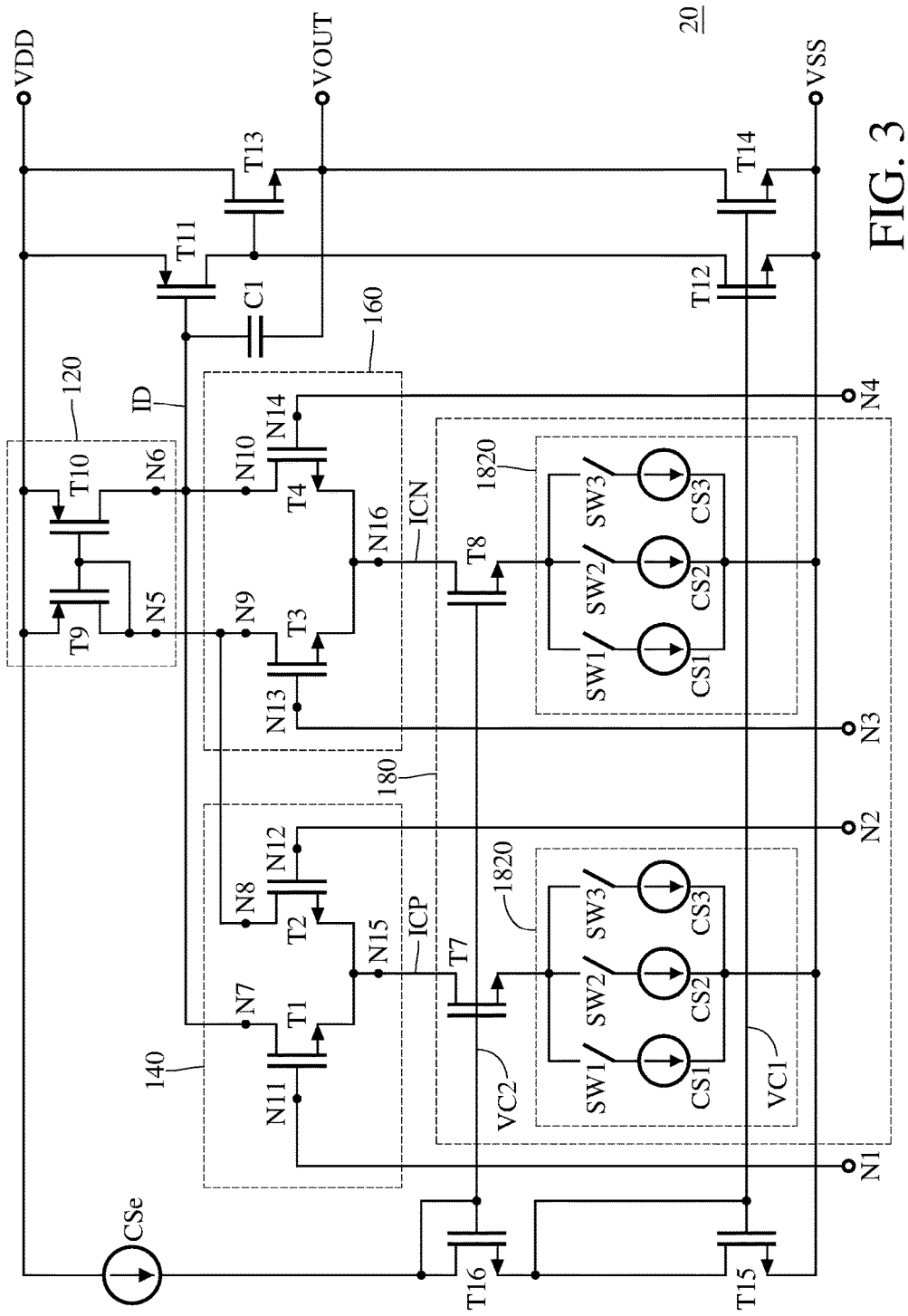
FIG. 3 is a schematic circuit diagram of a programmable gain amplifier according to yet another embodiment of the present disclosure.
Figure 4:
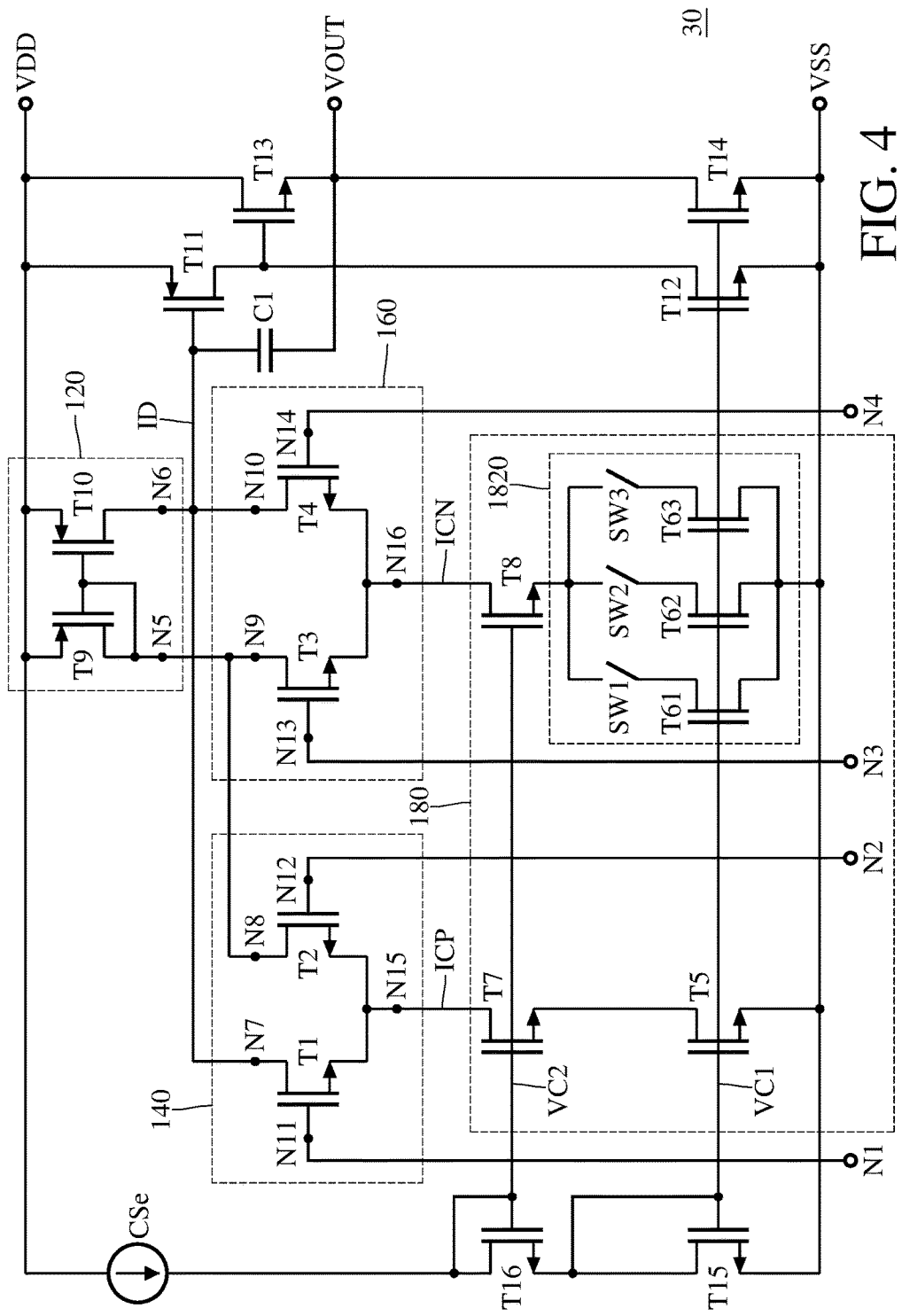
FIG. 4 is a schematic circuit diagram of a programmable gain amplifier according to yet another embodiment of the present disclosure.

Then, please refer to FIG. 3 and FIG. 4 to more particularly explain the method of adjusting the current flowing through the equivalent sixth transistor T6. FIG. 3 and FIG. 4 are schematic circuit diagrams of programmable gain amplifiers according to various embodiments of the present disclosure. In the embodiment shown in FIG. 3, the equivalent sixth transistor T6 is replaced by an adjustable current source 1820 electrically connected to the second current source end N16. The adjustable current source 1820 adjusts the potential of the second current ICN according to indication of at least one switching signal. The embodiments shown in FIG. 3 and FIG. 4 are based on an example in which the adjustable current source 1820 is used to adjust the second current ICN. In practice, the fifth transistor T5 can be defined as an equivalent transistor and is replaced by the adjustable current source 1820, so as to adjust the potential of the first current ICP. The related details can be reasonably deduced in view of the present disclosure by one of ordinary skill in the art, and thus, can be omitted hereafter.

As shown in FIG. 3, the adjustable current source 1820 includes a number of current sources and a number of switches. In this case, current sources CS1~CS3 and switches SW1~SW3 are used as representatives for an exemplary illustration, but the number of current sources and the number of switches are not limited thereto. Each of the switches is connected to one of the current sources in series. In the embodiment shown in FIG. 3, the current source CS1 is connected to the switch SW1 in series, the current source CS2 is connected to the switch SW2 in series, and the current source CS3 is connected to the switch SW3. Each series circuit constructed by a switch and a current source has two opposite ends, one of which is electrically connected to the second current source end N16 and the other one of which is configured to receive the second basis voltage VSS. In the embodiment shown in FIG. 4, the constant current sources CS1~CS3 are respectively the transistors T61~T63, and the two opposite ends of each of the transistors T61~T63 are respectively connected to one corresponding switch and one corresponding reference end. Each of the transistors T61~T63 forms a current mirror together with the fifth transistor T5. In this embodiment, the channel width-to-length (W/L) ratio of each transistor is exemplified by the channel W/L ratio of the fifth transistor T5 that is ⅓. This is only for an exemplary illustration, but the present disclosure is not limited to the above value.

In this case, when the switch SW1 is turned on, the current source CS1 is electrically connected to the second current source end N16 so that the current flowing through the second current source end N16 increases and the potential of the second current ICN accordingly increases. Similarly, when the switch SW2 and the switch SW3 are turned on or off, the potential of the second current ICN accordingly changes. As described above, the relationship in potential between the first current ICP and the second current ICN is associated with the equivalent gain of the programmable gain amplifier, so the equivalent gain of the programmable gain amplifier can be adjusted by selectively turning on the switches SW1~SW3 in the adjustable current source 1820. In this embodiment, the foregoing reference end is, e.g. the second basis voltage VSS, and the second basis voltage VSS is, e.g. a relatively-low voltage potential in the system.

In another embodiment, the adjustable current source 180 further includes a seventh transistor T7 and an eighth transistor T8. The first end and second end of the seventh transistor T7 are respectively and electrically connected to the first current source end N15 and the first end of the fifth transistor T5. The control end of the seventh transistor T7 is configured to receive a second control voltage VC2. The first end and second end of the eighth transistor T8 are respectively and electrically connected to the second current source end N16 and the adjustable current source 1820. The control end of the eighth transistor T8 is configured to receive the second control voltage VC2. On another aspect, the seventh transistor T7 forms a cascade structure together with the fifth transistor T5.

The active load module 120 includes a ninth transistor T9 and a tenth transistor T10. The first end of the ninth transistor T9 is configured to receive a first basis voltage VDD. The second end and control end of the ninth transistor T9 are electrically connected to the first load end N5. The first end of the tenth transistor T10 is configured to receive the first basis voltage VDD, the second end of the tenth transistor T10 is electrically connected to the second load end N6, and the control end of the tenth transistor T10 is electrically connected to the first load end N5.

On the other hand, in the embodiments shown in FIG. 2 to FIG. 4, the programmable gain amplifiers 10, 20 and 30 further include an eleventh transistor T11, a twelfth transistor T12, a thirteenth transistor T13 and a fourteenth transistor T14.

The first end of the eleventh transistor T11 is configured to receive the first basis voltage VDD, and the control end of the eleventh transistor T11 is electrically connected to the second load end N6. The first end of the twelfth transistor T12 is electrically connected to the second end of the eleventh transistor T11, the second end of the twelfth transistor T12 is configured to receive the second basis voltage VSS, and the control end of the twelfth transistor T12 is configured to receive the first control voltage VC1. On another aspect, the eleventh transistor T11 and the thirteenth transistor T13 construct a voltage follower to adjust the output impedance of the programmable gain amplifier relative to the backend circuit.

The first end of the thirteenth transistor T13 is configured to receive the first basis voltage VDD, the second end of the thirteenth transistor T13 is electrically connected to the output end NOUT and the second load end N6, and the control end of the thirteenth transistor T13 is electrically connected to the second end of the eleventh transistor T11. The first end of the fourteenth transistor T14 is electrically connected to the second end of the thirteenth transistor T13, and the second end of the fourteenth transistor T14 is configured to receive the second basis voltage VSS, and the control end of the fourteenth transistor T14 is configured to receive the first control voltage VC1.

Additionally, in the embodiments shown in FIG. 2 to FIG. 4, the programmable gain amplifiers 10, 20 and 30 further include transistors T15 and T16 and a current source CSe. The transistor T15 is configured to form a current mirror together with the fifth transistor T5. In the embodiment shown in FIG. 4, the transistor T15 forms a current mirror together with each of the transistors T61~T63. The transistor T16 respectively forms current mirrors together with the seventh transistor T7 and the eighth transistor T8. On the other hand, there is a capacitor C1 having two opposite ends respectively connected to the second load end N6 and the output end NO, so that a DC bias may be blocked. The related details can be reasonably deduced in view of the present disclosure by one of ordinary skill in the art, and thus, can be omitted hereafter.

To sum up, the present disclosure provides a programmable gain amplifier, which includes at least two differential pairs and a power source module. The input end of one of the differential pairs is electrically connected to the output end of the programmable gain amplifier, so as to form a feedback loop. The power source module supplies a first current to one of the differential pairs, and supplies a second current to the other differential pair. Moreover, the power source module can further adjust the potential of the first current, the potential of the second current or both. By the disposition of the feedback loop and the adjustment of the first or second current, it is possible to control the equivalent gain of the programmable gain amplifier. On the other hand, it is also possible that by the design of a variety of circuit connections among a number of differential pairs, the programmable gain amplifier provided in the present disclosure has no physical resistor disposed therein, efficiently blocks noises, and does not amplify noises while amplifying signals, and thus, reduces the signal-to-noise ratio at the output end.

What is claimed is:

1. A programmable gain amplifier, comprising:
    an active load module comprising a first load end and a second load end, and the second load end of the active load module being electrically connected to an output end of the programmable gain amplifier;
    a first differential pair comprising a first input end, a second input end, a first current source end, a first output end and a second output end, the first output end of the first differential pair being electrically connected to the second load end of the active load module, the second output end of the first differential pair being electrically connected to the first load end of the active load module, the first input end of the first differential pair being configured to receive an input signal, and the second input end of the first differential pair being configured to receive a common mode voltage;
    a second differential pair comprising a third input end, a fourth input end, a second current source end, a third output end and a fourth output end, the third output end of the second differential pair being electrically connected to the first load end of the active load module, the fourth output end of the second differential pair being electrically connected to the second load end of the active load module, the third input end of the second differential pair being electrically connected to the output end of the programmable gain amplifier and being configured to receive a feedback signal, and the fourth input end of the second differential pair being configured to receive the common mode voltage; and
    a power source module electrically connected to the first current source end of the first differential pair and the second current source end of the second differential pair, the power source module being configured to supply a first current to the first differential pair through the first current source end of the first differential pair, the power source module being configured to supply a second current to the second differential pair through the second current source end of the second differential pair, and the power source module being configured to adjust a current potential of the first current, a current potential of the second current or both.

2. The programmable gain amplifier according to claim 1, wherein the first differential pair comprises a first transistor and a second transistor, the second differential pair comprises a third transistor and a fourth transistor;
    a first end of the first transistor is electrically connected to the second load end of the active load module, a second end of the first transistor is electrically connected to the power source module, and a control end of the first transistor is configured to receive the input signal;
    a first end of the second transistor is electrically connected to the first load end of the active load module, a second end of the second transistor is electrically connected to the power source module and the second end of the first transistor, and a control end of the second transistor is configured to receive the common mode voltage;
    a first end of the third transistor is electrically connected to the first load end of the active load module, a second end of the third transistor is electrically connected to the power source module, and a control end of the third transistor is configured to receive the feedback signal; and
    a first end of the fourth transistor is electrically connected to the second load end of the active load module, a second end of the fourth transistor is electrically connected to the power source module and the second end of the third transistor, and a control end of the fourth transistor is configured to receive the common mode voltage.

3. The programmable gain amplifier according to claim 1, wherein the power source module comprising an adjustable current source, which is electrically connected to one of the first current source end of the first differential pair and the second current source end of the second differential pair, and the adjustable current source adjusts either the potential of the first current or the potential of the second current according to a first control voltage and indication of at least one switching signal.

4. The programmable gain amplifier according to claim 3, wherein the adjustable current source comprising:
    current sources; and
    switches, being controlled by the at least one switching signal, wherein each of the switches is connected to one of the current sources in series, the switch and the current source, which are connected in series, are located between and respectively and electrically connected to a current output end and a reference end.

5. The programmable gain amplifier according to claim 3, wherein the power source module further comprising a fifth transistor, a first end of the fifth transistor is electrically connected to the other one of the first current source end of the first differential pair and the second current source end of the second differential pair, and a control end of the fifth transistor is configured to receive the first control voltage.

6. The programmable gain amplifier according to claim 5, wherein the power source module further comprising:
    a seventh transistor, a first end of the seventh transistor being electrically connected to the first current source end of the first differential pair, a second end of the seventh transistor being electrically connected to the first end of the fifth transistor, and a control end of the seventh transistor being configured to receive a second control voltage; and
    an eighth transistor, a first end of the eighth transistor being electrically connected to the second current source end of the second differential pair, a second end of the eighth transistor being electrically connected to a first end of the adjustable current source, and a control end of the eighth transistor being configured to receive the second control voltage.

7. The programmable gain amplifier according to claim 1, wherein the active load module comprising:
    a ninth transistor, a first end of the ninth transistor being configured to receive a first basis voltage, a second end of the ninth transistor being electrically connected to the first load end of the active load module, and a control end of the ninth transistor being electrically connected to the first load end of the active load module; and
    a tenth transistor, a first end of the tenth transistor being configured to receive the first basis voltage, a second end of the tenth transistor being electrically connected to the second load end of the active load module, and a control end of the tenth transistor being electrically connected to the first load end of the active load module.

8. The programmable gain amplifier according to claim 1, further comprising a eleventh transistor and a twelfth transistor,
    wherein a first end of the eleventh transistor is configured to receive a first basis voltage, and a control end of the eleventh transistor is electrically connected to the second load end of the active load module; and a first end of the twelfth transistor is electrically connected to a second end of the eleventh transistor, a second end of the twelfth transistor is configured to receive a second basis voltage, and a control end of the twelfth transistor is configured to receive a first control voltage.

9. The programmable gain amplifier according to claim 8, further comprising a thirteenth transistor and a fourteenth transistor, wherein a first end of the thirteenth transistor is configured to receive the first basis voltage, a second end of the thirteenth transistor is electrically connected to the output end of the programmable gain amplifier and the second load end of the active load module, and a control end of the thirteenth transistor is electrically connected to the second end the eleventh transistor; and a first end of the fourteenth transistor is electrically connected to the second end of the thirteenth transistor, a second end of the fourteenth transistor is configured to receive the second basis voltage, and a control end of the fourteenth transistor is configured to receive the first control voltage.

10. The programmable gain amplifier according to claim 1, wherein when the first current is substantially equal to the second current, an equivalent gain of the programmable gain amplifier is substantially 2;

when the first current is larger than the second current, the equivalent gain of the programmable gain amplifier is larger than 2; and when the first current is less than the second current, the equivalent gain of the programmable gain amplifier is smaller than 2.

* * * * *